United States Patent
Yokonuma

(10) Patent No.: US 8,477,280 B2
(45) Date of Patent: Jul. 2, 2013

(54) LIQUID CRYSTAL PANEL

(75) Inventor: Shinsuke Yokonuma, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 201 days.

(21) Appl. No.: 12/998,860

(22) PCT Filed: Oct. 5, 2009

(86) PCT No.: PCT/JP2009/067321
§ 371 (c)(1),
(2), (4) Date: Jun. 9, 2011

(87) PCT Pub. No.: WO2010/100783
PCT Pub. Date: Sep. 10, 2010

(65) Prior Publication Data
US 2011/0234962 A1 Sep. 29, 2011

(30) Foreign Application Priority Data
Mar. 5, 2009 (JP) .................... 2009-051425

(51) Int. Cl.
*G02F 1/1345* (2006.01)
(52) U.S. Cl.
USPC .......................................... 349/152
(58) Field of Classification Search
USPC ............................. 349/40, 43, 152
See application file for complete search history.

(56) References Cited

U.S. PATENT DOCUMENTS 5,936,598 A * 8/1999 Hayama et al. .................. 345/76

FOREIGN PATENT DOCUMENTS

| EP | 1 965 372 | | 9/2008 |
|---|---|---|---|
| JP | 2000258792 | A | 9/2000 |
| JP | 200177538 | A | 3/2001 |
| JP | 2003-167264 | | 6/2003 |
| JP | 2005345704 | A | 12/2005 |
| JP | 2006301533 | A | 11/2006 |

* cited by examiner

*Primary Examiner* — James Dudek
(74) *Attorney, Agent, or Firm* — Harness, Dickey & Pierce, P.L.C.

(57) ABSTRACT

When a counter signal line 13 electrically connected to a counter electrode 24 is provided on an active matrix substrate 11, a coil 14 is formed by allowing a part of the counter signal line 13 to make a loop in a plane parallel to the substrate. To form the coil 14, two wiring layers provided to the active matrix substrate 11 are used. By inserting the coil 14 in series with the counter signal line 13, high-frequency noise placed on a counter electrode voltage is suppressed and a liquid crystal applied voltage is stabilized, improving the display quality of a liquid crystal screen. A similar coil may be formed using a power supply line on the active matrix substrate 11. By this, a liquid crystal panel which is highly immune to noise even without providing anti-noise components is provided.

8 Claims, 4 Drawing Sheets

LIQUID CRYSTAL PANEL

TECHNICAL FIELD

The present invention relates to a liquid crystal panel used for a display unit of various electronic devices.

BACKGROUND ART

An electronic device is required to have two features concerning electrical noise, that is, noise generated by the device is so small that it does not adversely affect other devices and the device does not malfunction even if it receives a certain amount of noise from another device (EMC: Electro-Magnetic Compatibility). In an electronic device that performs wireless communication and an electronic device that performs high-speed operation (e.g., a mobile phone), even if noise generated from another device is cut off, noise generated from those electronic devices may adversely affect the performance of the devices.

For example, in a flip type mobile phone shown in FIG. 5, a cover-side casing 81 contains a liquid crystal module 83, and a body casing 82 contains a CPU 84, a logic circuit 85, a high-frequency circuit 86, a communication antenna 87, etc. To connect the liquid crystal module 83 in the cover-side casing 81 to the CPU 84 in the body casing 82, a flexible printed circuit (hereinafter, referred to as the FPC) 88 is provided therebetween.

The communication antenna 87 radiates electromagnetic waves in accordance with control from the high-frequency circuit 86. Some of the radiated electromagnetic waves affect wirings on the FPC 88 and thus noise is placed on the wirings on the FPC 88. For example, the wirings on the FPC 88 are connected to a liquid crystal module control circuit. If noise is placed on the wirings, then noise is also placed on a counter electrode voltage of a liquid crystal panel through the liquid crystal module control circuit, and accordingly, a liquid crystal applied voltage becomes unstable, degrading the display quality of a liquid crystal screen. As a method to solve this problem, a method is conventionally known in which anti-noise components (e.g., a bypass capacitor or a common-mode choke coil) are provided on signal lines from which the influence of noise is to be eliminated. In the mobile phone shown in FIG. 5, anti-noise components can be provided on the FPC 88.

Note that in relation to the invention of the present application, Patent document 1 describes that in order to obtain a reactance value in a substrate pattern, as shown in FIG. 6, C-shaped coil patterns 92a to 92d are formed on surfaces of respective layers 91a to 91c of a build-up multi-layer substrate 90, and the coil patterns 92a to 92d are connected by build-up vias 93a to 93c, whereby a helical coil is formed as a whole.

RELATED DOCUMENTS

Patent Documents

[Patent Document 1] Japanese Laid-Open Patent Publication No. 2001-77538

SUMMARY OF THE INVENTION

Problems to be Solved by the Invention

In recent years, there has been a more intensive demand for miniaturization of electronic devices and also there has been an intensive demand for the noise immunity of electronic devices. Meanwhile, there is a limit to a component mounting area on an FPC. Hence, it has become more difficult to provide anti-noise components on an FPC over conventional cases. In addition, there is another problem that providing anti-noise components increases the cost of electronic devices.

An object of the present invention is therefore to provide a liquid crystal panel which is highly immune to noise even without providing anti-noise components.

Means for Solving the Problems

According to a first aspect of the present invention, there is provided a liquid crystal panel having a structure in which a liquid crystal is sandwiched between a pair of substrates, the liquid crystal panel including: an active matrix substrate having a plurality of pixel circuits formed on a glass substrate, each pixel circuit including a switching element and a pixel electrode; and a counter substrate having a counter electrode formed on another glass substrate, the counter electrode facing the pixel electrodes, wherein the active matrix substrate includes a coil formed by allowing a part of at least one of a counter signal line electrically connected to the counter electrode and a power supply line on the substrate to make a loop in a plane parallel to the substrate.

According to a second aspect of the present invention, in the first aspect of the present invention, the coil is formed using a part of the counter signal line and is provided between an external terminal connected to the counter signal line and a connecting point between the counter signal line and the counter electrode, the connecting point being a closest one to the external terminal.

According to a third aspect of the present invention, in the first aspect of the present invention, the counter signal line includes a loop-like wiring surrounding an area where the pixel circuits are disposed, and the coil is formed using a part of the counter signal line.

According to a fourth aspect of the present invention, in the first aspect of the present invention, the switching elements are formed using two wiring layers provided to the active matrix substrate, and the coil is formed by electrically connecting wirings respectively provided in the two wiring layers.

According to a fifth aspect of the present invention, in the fourth aspect of the present invention, the coil is formed by connecting the wirings respectively provided in the two wiring layers, using an interlayer connecting member.

According to a sixth aspect of the present invention, in the fourth aspect of the present invention, the coil is formed by respectively providing the two wiring layers with the wirings which are in direct contact with each other.

According to a seventh aspect of the present invention, in the first aspect of the present invention, the active matrix substrate includes, as the coil, a plurality of single-wound coils connected in series.

According to an eighth aspect of the present invention, in the seventh aspect of the present invention, the single-wound coils include a coil having a certain winding direction and a coil having a reverse winding direction.

Effect of the Invention

According to the first aspect of the present invention, by inserting a coil in series with a counter signal line or a power supply line on an active matrix substrate, noise placed on these wirings is eliminated, enabling to increase the noise immunity of a liquid crystal panel. By inserting a coil in series with the counter signal line, noise placed on a counter electrode voltage is eliminated and thus a liquid crystal applied voltage is stabilized, enabling to improve the display quality of a liquid crystal screen. By inserting a coil in series with the power supply line, noise placed on the power supply line is eliminated and thus a power supply voltage is stabilized, enabling to improve the display quality of the liquid crystal screen. In addition, since the coil is formed by allowing the counter signal line or the power supply line on the active matrix substrate to make a loop, there is no need to provide anti-noise components around the liquid crystal panel. Accordingly, a liquid crystal panel which is highly immune to noise even without providing anti-noise components can be obtained.

According to the second aspect of the present invention, by inserting the coil between an external terminal connected to the counter signal line and a connecting point between the counter signal line and a counter electrode, the connecting point being the closest one to the external terminal, noise placed on the counter electrode voltage is more effectively eliminated, enabling to further improve the display quality of the liquid crystal screen.

According to the third aspect of the present invention, even when a current flows through the counter signal line including a loop-like wiring due to electromagnetic induction and accordingly noise is placed on the counter electrode voltage, by inserting a coil in series with the counter signal line, the noise is eliminated, enabling to improve the display quality of the liquid crystal screen.

According to the fourth to sixth aspects of the present invention, by allowing the counter signal line or the power supply line to make a loop in a plane parallel to the substrate, using two wiring layers provided to the active matrix substrate, a coil having a noise removal function can be easily formed.

According to the seventh aspect of the present invention, by allowing the counter signal line or the power supply line on the active matrix substrate to make loops in the plane parallel to the substrate, a plurality of single-wound coils connected in series, each having a noise removable function, can be easily formed.

According to the eighth aspect of the present invention, by forming a mixture of two types of single-wound coils having different winding directions, two types of magnetic fluxes with different directions are generated when a current flows through the coils, decreasing external magnetic flux leakage due to magnetic flux coupling, whereby external influence can be reduced.

MODE FOR CARRYING OUT THE INVENTION

Figure 1:
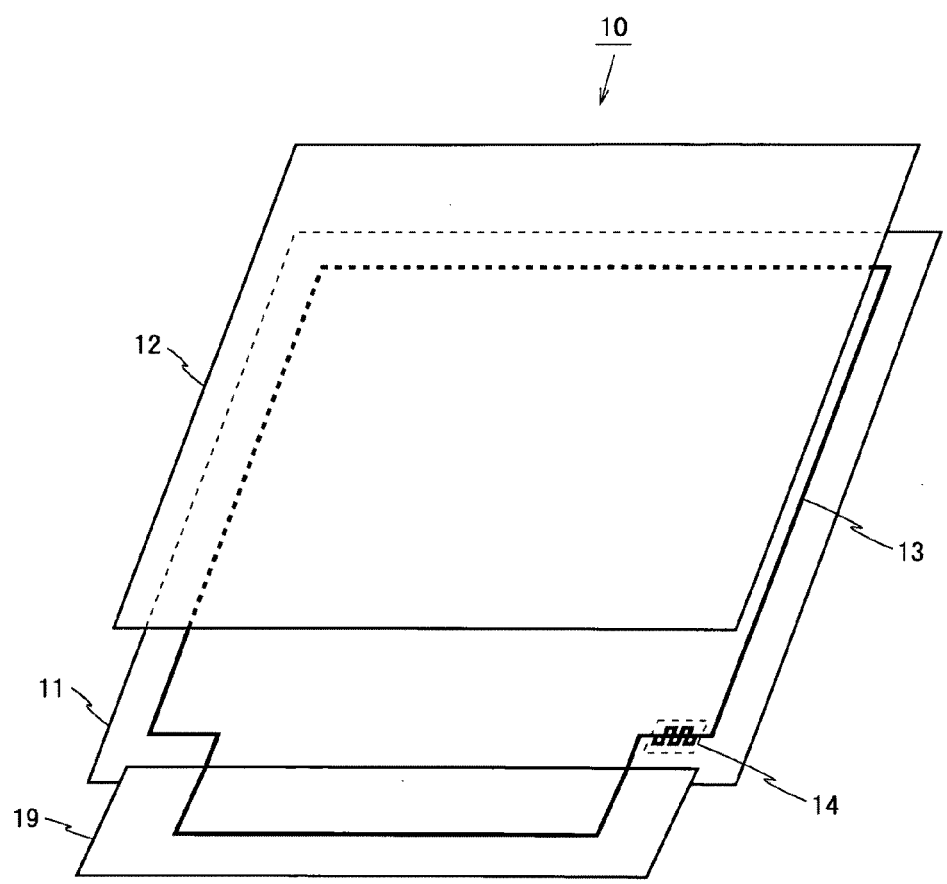
FIG. 1 is an exploded perspective view showing a configuration of a liquid crystal panel according to an embodiment of the present invention.

FIG. 1 is an exploded perspective view showing a configuration of a liquid crystal panel according to an embodiment of the present invention. FIG. 1 depicts a liquid crystal panel 10 according to the present embodiment and an FPC (flexible printed circuit) 19 connected to the liquid crystal panel 10. As shown in FIG. 1, the liquid crystal panel 10 includes an active matrix substrate 11 and a counter substrate 12. The active matrix substrate 11 is such that a plurality of pixel circuits, each including a switching element and a pixel electrode, are formed on a glass substrate. The counter substrate 12 is such that a counter electrode facing the pixel electrodes is formed on another glass substrate. A liquid crystal (not shown) is filled between the active matrix substrate 11 and the counter substrate 12. As such, the liquid crystal panel 10 has a structure in which a liquid crystal is sandwiched between a pair of substrates.

Figure 2:
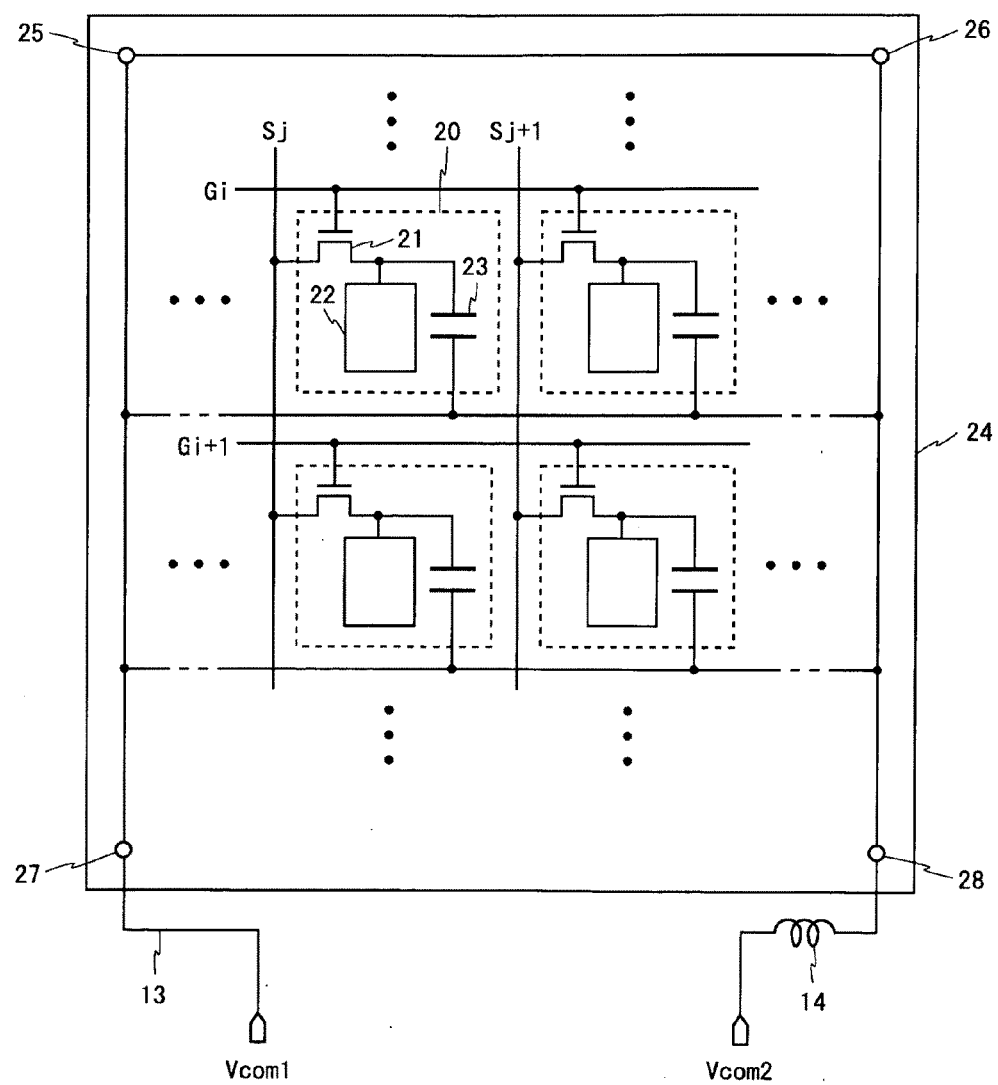
FIG. 2 is a circuit diagram of circuits formed on the liquid crystal panel shown in FIG. 1.

FIG. 2 is a circuit diagram of circuits formed on the liquid crystal panel 10. A counter electrode 24 shown in FIG. 2 is formed on substantially the entire surface of the counter substrate 12. Substrate-to-substrate connecting members 25 to 28 are provided between the active matrix substrate 11 and the counter substrate 12 and in positions corresponding to the four corners of the counter electrode 24. Other components shown in FIG. 2 are formed on the active matrix substrate 11.

On the active matrix substrate 11 are formed a plurality of scanning signal lines Gi parallel to one another, and a plurality of data signal lines Sj parallel to one another and intersecting perpendicularly with the scanning signal lines Gi. The scanning signal lines Gi and the data signal lines Sj are connected to external terminals (not shown) provided on the active matrix substrate 11, or a drive circuit (not shown) formed on the active matrix substrate 11. The scanning signal lines Gi and the data signal lines Sj are driven by a drive circuit provided external to the liquid crystal panel 10, or a drive circuit which is integrally formed with the liquid crystal panel 10.

Pixel circuits 20 are formed near the respective intersections of the scanning signal lines Gi and the data signal lines Sj. Each pixel circuit 20 includes a thin film transistor (hereinafter, referred to as the TFT) 21 that functions as a switching element, a pixel electrode 22, and an auxiliary capacitance 23. A gate electrode of the TFT 21 is connected to a corresponding scanning signal line Gi, a source electrode is connected to a corresponding data signal line Sj, and a drain electrode is connected to the pixel electrode 22 and one electrode of the auxiliary capacitance 23. The other electrode of the auxiliary capacitance 23 is connected to a counter signal line 13. The counter electrode 24 is disposed to face all of the pixel electrodes 22, whereby a liquid crystal capacitance is formed for each pixel circuit.

The counter signal line 13 includes a loop-like wiring surrounding an area where the pixel circuits 20 are disposed; and wirings crossing the area where the pixel circuits 20 are disposed (wirings parallel to the scanning signal lines Gi). One end of the loop-like wiring is provided with an external terminal Vcom1, and the other end is provided with an external terminal Vcom2. To the external terminals Vcom1 and Vcom2 is provided the same voltage from a liquid crystal module control circuit (not shown) disposed on the FPC 19. The loop-like wiring is connected in the middle to the substrate-to-substrate connecting members 25 to 28 at four locations. By thus electrically connecting the counter electrode 24 to the external terminals Vcom1 and Vcom2 through the substrate-to-substrate connecting members 25 to 28 and the counter signal line 13, a desired voltage (counter electrode voltage) can be applied to the counter electrode 24 externally. Note that the reason why the counter electrode voltage is applied by the above-described method is to make the counter electrode voltage constant independent of locations on the counter electrode 24.

The counter signal line 13 is formed such that a part thereof makes small loops in a plane parallel to the active matrix substrate 11. By this, a coil 14 is inserted in series with the counter signal line 13. In the liquid crystal panel 10, the counter signal line 13 and the counter electrode 24 are electrically connected to each other at four locations. Of the four connecting points, a connecting point present at the location of the substrate-to-substrate connecting member 28 is closest to the external terminal Vcom2. Taking this into account, the coil 14 is formed between the external terminal Vcom2 and the connecting point present at the location of the substrate-to-substrate connecting member 28. As such, in the liquid crystal panel 10, the coil 14 is formed by allowing a part of the counter signal line 13 to make loops in a plane parallel to the active matrix substrate 11 and between the external terminal Vcom2 and a connecting point between the counter signal line 13 and the counter electrode 24, the connecting point being the closest one to the external terminal Vcom2.

Figure 3:
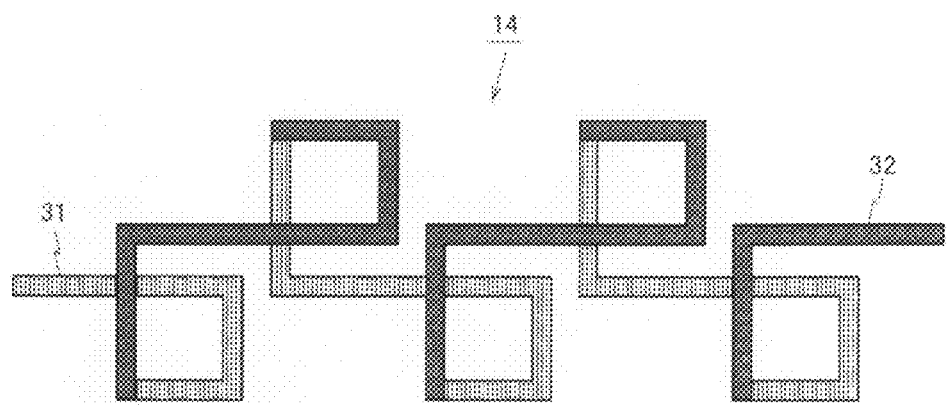
FIG. 3 is a plan view of a coil inserted in a counter signal line of the liquid crystal panel shown in FIG. 1.
Figure 4:
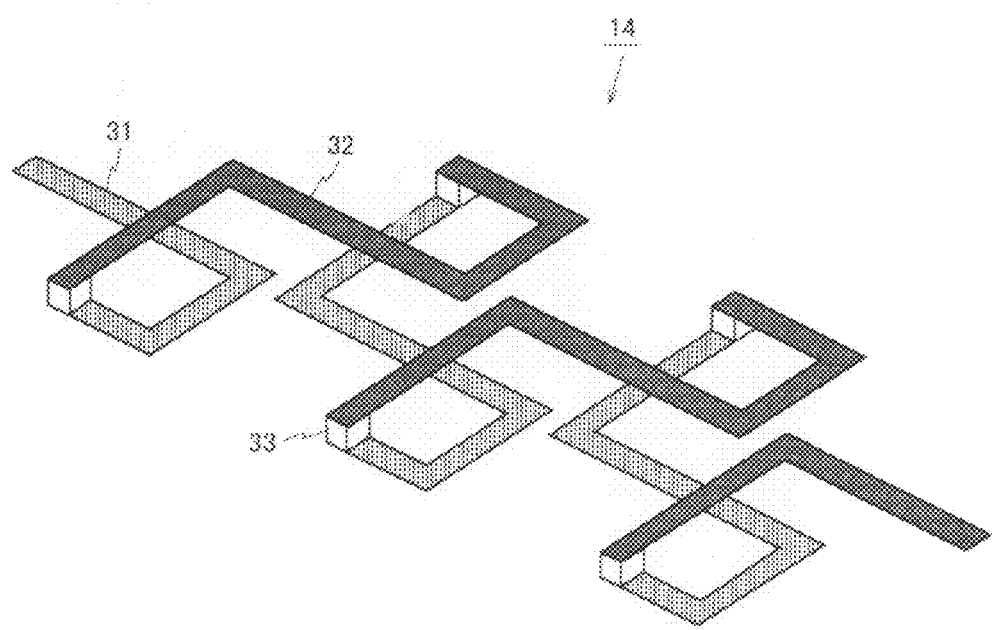
FIG. 4 is a perspective view of the coil inserted in the counter signal line of the liquid crystal panel shown in FIG. 1.

FIG. 3 is a plan view of the coil 14 and FIG. 4 is a perspective view of the coil 14. The active matrix substrate 11 has two metal wiring layers (hereinafter, referred to as the first wiring layer and the second wiring layer) to form the TFTs 21. The first wiring layer is used to form the gate electrodes of the TFTs 21, etc., and the second wiring layer is used to form the source electrodes of the TFTs 21, etc. As shown in FIGS. 3 and 4, the coil 14 is formed by connecting wirings 31 of the first wiring layer to wirings 32 of the second wiring layer using contacts 33. In other words, the coil 14 is formed by connecting, using interlayer connecting members, the wirings 31 and 32 respectively provided in two wiring layers which are used when the TFTs 21 are formed.

The coil 14 shown in FIGS. 3 and 4 includes five single-wound coils connected in series. The five single-wound coils include coils having a certain winding direction and coils having a reverse winding direction. It is preferable that the numbers of these two types of single-wound coils are substantially the same (three coils and two coils in this example).

Note that although the coil 14 shown in FIG. 4 is formed by connecting the wirings 31 and 32 using the contacts 33, a coil may be formed by respectively providing the first wiring layer and the second wiring layer with wirings which are in direct contact with each other. As such, a coil is formed by electrically connecting wirings which are respectively provided in two wiring layers provided to the active matrix substrate.

Figure 5:
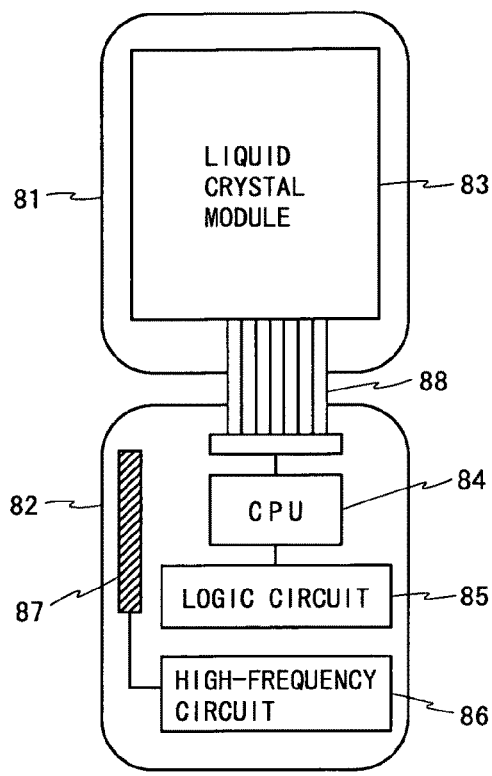
FIG. 5 is a block diagram showing an exemplary configuration of a mobile phone.
Figure 6:
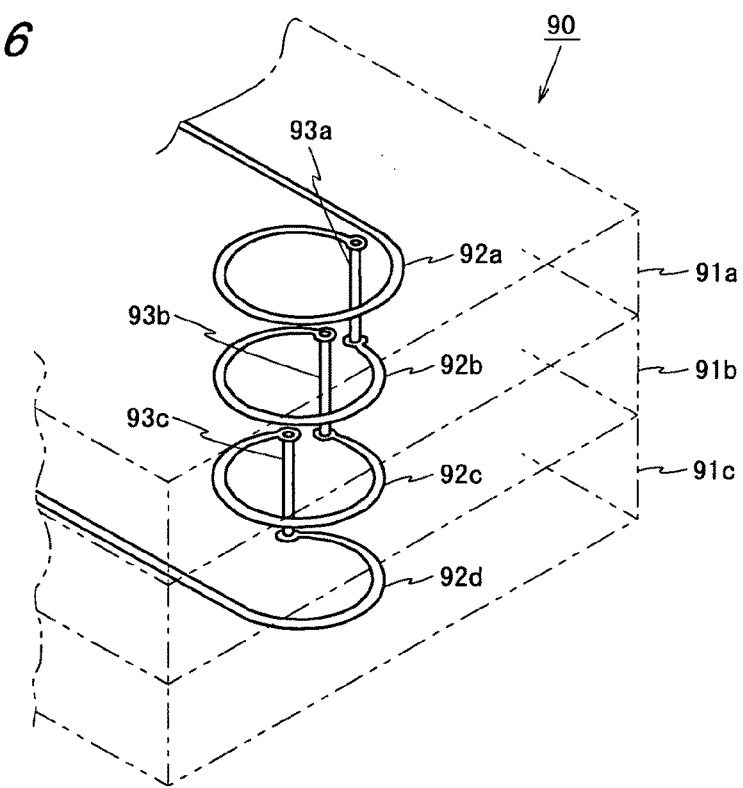
FIG. 6 is a diagram showing a pattern coil of a conventional printed board.

The effects of the liquid crystal panel 10 according to the present embodiment will be described below comparing with a conventional liquid crystal panel with no coil 14. Here, the case is considered in which the conventional liquid crystal panel and the liquid crystal panel 10 according to the present embodiment are used by being included in a liquid crystal module 83 of a mobile phone shown in FIG. 5. In the mobile phone shown in FIG. 5, the liquid crystal module 83 and a CPU 84 are contained in different casings and they are connected to each other using an FPC 88. In general, wirings on the FPC 88 are longer than wirings on a rigid substrate and thus are susceptible to noise. In addition, the counter signal line 13 includes a loop-like wiring (see FIGS. 1 and 2). Under such conditions, the CPU 84 performs high-speed operation to implement the functions of a mobile phone, and a communication antenna 87 radiates electromagnetic waves in accordance with control from a high-frequency circuit 86.

When the CPU 84 performs high-speed operation, high-frequency energy is generated and the generated high-frequency energy is radiated as electromagnetic waves from a power supply or ground. The wirings on the FPC 88 are susceptible to noise and thus function as an antenna that receives the radiated electromagnetic waves. Due to this, high-frequency noise is placed on the wirings on the FPC 88 and thus a power supply voltage supplied to a liquid crystal module control circuit of the liquid crystal module 83 becomes unstable. The counter signal line 13 is connected to the liquid crystal module control circuit provided on the FPC 88. Since the power supply voltage supplied to the liquid crystal module control circuit is unstable, high-frequency noise is also placed on a counter electrode voltage outputted to the counter signal line 13.

If a magnetic flux of electromagnetic waves radiated from the communication antenna 87 passes through the loop-like wiring of the counter signal line 13, then a current flows through the loop-like wiring due to electromagnetic induction. The induced current flowing through at this time acts as high-frequency noise to a current that is supposed to flow through the counter signal line 13 essentially. Hence, high-frequency noise is also placed on a counter electrode voltage applied to the counter signal line 13. When the conventional liquid crystal panel is used, since high-frequency noise is placed on the counter electrode voltage in the above-described two paths, a liquid crystal applied voltage becomes unstable, degrading the display quality of a liquid crystal screen.

On the other hand, in the liquid crystal panel 10 according to the present embodiment, by allowing a part of the counter signal line 13 to make loops in a plane parallel to the active matrix substrate 11, the coil 14 is inserted in series with the counter signal line 13. In general, when the self-inductance of the coil is L and the frequency of an AC signal flowing through the coil is f, the impedance Z of the coil is given by $Z=2\pi f L$. When the frequency f of the AC signal increases, the impedance Z increases and thus the coil functions as a resistor. As such, the coil has the property of allowing a low-frequency signal to pass therethrough and converting high-frequency noise into heat and thereby cutting off the high-frequency noise.

When configuring the liquid crystal panel 10 according to the present embodiment, a cut-off frequency is determined according to the frequency of electromagnetic waves radiated from an electronic device including the liquid crystal panel 10, and an inductance of the coil 14 is determined. Then, to obtain the determined inductance, the configuration of the coil 14 (the number of single-wound coils, size, wiring width, connecting form, etc.) is determined. When determining the configuration of the coil 14, the characteristics and thickness of an insulating layer between two wiring layers provided to the active matrix substrate 11, etc., are considered.

When the coil 14 designed in this manner is inserted in series with the counter signal line 13, even when the CPU 84 performs high-speed operation and thus electromagnetic waves are radiated, high-frequency noise placed on the wirings on the FPC 88 is eliminated by the coil 14, enabling to stabilize a power supply voltage supplied to the liquid crystal module control circuit of the liquid crystal module 83. In addition, even when electromagnetic waves are radiated from the communication antenna 87, an induced current flowing through the counter signal line 13 is converted into heat by the coil 14 and thereby can be eliminated. By this, high-frequency noise placed on the counter electrode voltage is eliminated and thus the liquid crystal applied voltage is stabilized, enabling to improve the display quality of the liquid crystal screen.

Since the coil 14 is formed by allowing the counter signal line on the active matrix substrate 11 to make loops, there is no need to provide anti-noise components around the liquid crystal panel 10. Therefore, regardless of the component mounting area on the FPC 19, the noise immunity of the liquid crystal panel 10 can be increased.

As described above, in a liquid crystal panel according to the present embodiment, an active matrix substrate has formed thereon a coil obtained by allowing a part of a counter signal line to make loops in a plane parallel to the substrate. By inserting the coil in series with the counter signal line, noise placed on a counter electrode voltage is suppressed and thus a liquid crystal applied voltage is stabilized, enabling to improve the display quality of a liquid crystal screen. In addition, since the coil is formed by allowing a part of the counter signal line to make loops, there is no need to provide anti-noise components around the liquid crystal panel.

The coil is formed between an external terminal connected to the counter signal line and a connecting point between the counter signal line and a counter electrode, the connecting point being the closest one to the external terminal. By inserting the coil at this location, noise placed on the counter electrode voltage is more effectively suppressed, enabling to further improve the display quality of the liquid crystal screen.

Even when a current flows through the counter signal line including a loop-like wiring due to electromagnetic induction and accordingly noise is placed on the counter electrode voltage, by inserting a coil in series with the counter signal line, the noise is suppressed, enabling to improve the display quality of the liquid crystal screen.

A coil is formed by electrically connecting wirings which are respectively provided in two wiring layers provided to the active matrix substrate. By allowing the counter signal line to make loops using those two wiring layers, a coil having a noise removal function can be easily formed.

The active matrix substrate has formed thereon a plurality of single-wound coils connected in series. The single-wound coils include a coil having a certain winding direction and a coil having a reverse winding direction. Such single-wound coils can be easily formed by allowing the counter signal line on the active matrix substrate to make loops in a plane parallel to the substrate. By forming a mixture of two types of single-wound coils, two types of magnetic fluxes with different directions are generated when a current flows through the coils, decreasing external magnetic flux leakage due to magnetic flux coupling, whereby external influence can be reduced.

Note that although in the above-described description a coil is formed using a counter signal line, a similar coil may be formed using a power supply line on an active matrix substrate. Note also that a coil may be formed using the power supply line on the active matrix substrate along with the formation of a coil using the counter signal line. By this, even when high-frequency noise is placed on a power supply voltage supplied to a liquid crystal module control circuit and a step-up circuit formed on a liquid crystal panel, high-frequency noise placed on a power supply voltage supplied to the power supply line on the active matrix substrate from the step-up circuit is eliminated and thus the power supply voltage is stabilized, enabling to improve the display quality of a liquid crystal screen. In this manner, a liquid crystal panel which is highly immune to noise even without providing anti-noise components can be obtained.

INDUSTRIAL APPLICABILITY

A liquid crystal panel of the present invention has a feature that the liquid crystal panel is highly immune to noise even without providing anti-noise components, and thus, can be used for a display unit of various electronic devices such as mobile phones, etc.

DESCRIPTION OF REFERENCE NUMERALS

10: LIQUID CRYSTAL PANEL
11: ACTIVE MATRIX SUBSTRATE
12: COUNTER SUBSTRATE
13: COUNTER SIGNAL LINE
14: COIL
20: PIXEL CIRCUIT
21: TFT
22: PIXEL ELECTRODE
23: AUXILIARY CAPACITANCE
24: COUNTER ELECTRODE
25 to 28: SUBSTRATE-TO-SUBSTRATE CONNECTING MEMBER
31: WIRING OF FIRST WIRING LAYER
32: WIRING OF SECOND WIRING LAYER
33: CONTACT

The invention claimed is:

1. A liquid crystal panel having a structure in which a liquid crystal is sandwiched between a pair of substrates, the liquid crystal panel comprising:
    an active matrix substrate having a plurality of pixel circuits formed on a glass substrate, each pixel circuit including a switching element and a pixel electrode; and
    a counter substrate having a counter electrode formed on another glass substrate, the counter electrode facing the pixel electrodes, wherein
    the active matrix substrate includes a coil formed by allowing a part of at least one of a counter signal line electrically connected to the counter electrode and a power supply line on the substrate to make a loop in a plane parallel to the substrate.

2. The liquid crystal panel according to claim 1, wherein the coil is formed using a part of the counter signal line and is provided between an external terminal connected to the counter signal line and a connecting point between the counter signal line and the counter electrode, the connecting point being a closest one to the external terminal.

3. The liquid crystal panel according to claim 1, wherein
    the counter signal line includes a loop-like wiring surrounding an area where the pixel circuits are disposed, and
    the coil is formed using apart of the counter signal line.

4. The liquid crystal panel according to claim 1, wherein
    the switching elements are formed using two wiring layers provided to the active matrix substrate, and
    the coil is formed by electrically connecting wirings respectively provided in the two wiring layers.

5. The liquid crystal panel according to claim 4, wherein the coil is formed by connecting the wirings respectively provided in the two wiring layers, using an interlayer connecting member.

6. The liquid crystal panel according to claim 4, wherein the coil is formed by respectively providing the two wiring layers with the wirings which are in direct contact with each other.

7. The liquid crystal panel according to claim 1, wherein the active matrix substrate includes, as the coil, a plurality of single-wound coils connected in series.

8. The liquid crystal panel according to claim 7, wherein the single-wound coils include a coil having a certain winding direction and a coil having a reverse winding direction.

* * * * *